United States Patent [19]
Khandros et al.

[11] Patent Number: 5,998,864
[45] Date of Patent: Dec. 7, 1999

[54] STACKING SEMICONDUCTOR DEVICES, PARTICULARLY MEMORY CHIPS

[75] Inventors: Igor Y. Khandros, Orinda; David V. Pedersen, Scotts Valley, both of Calif.

[73] Assignee: Formfactor, Inc., Livermore, Calif.

[21] Appl. No.: 08/863,511

[22] Filed: May 27, 1997

Related U.S. Application Data

[63] Continuation-in-part of application No. 08/452,255, May 26, 1995, and application No. PCT/US95/14909, Nov. 13, 1995, each is a continuation-in-part of application No.08/340,144, Nov. 15, 1994, Pat. No. 5,917,707, and application No. PCT/US94/13373, Nov. 16, 1994, which is a continuation-in-part of application No. 08/152,812, Nov. 16, 1993, Pat. No. 5,476,211, said application No. PCT/US94/13373, is a continuation-in-part of application No. 08/152,812

[60] Provisional application No. 60/046,028, May 9, 1997.

[51] Int. Cl.⁶ .............................. H01L 23/02; H05K 7/00
[52] U.S. Cl. ........................ 257/723; 257/730; 257/731; 257/777; 257/778; 257/786; 257/686; 257/668; 257/691; 257/698; 257/724; 361/735
[58] Field of Search ...................... 257/723, 725, 257/730, 731, 777, 778, 780, 685, 686, 668, 691, 698, 724, 786; 361/735

[56] References Cited

U.S. PATENT DOCUMENTS

| | | | |
|---|---|---|---|
| 4,949,163 | 8/1990 | Sudo et al. ............... | 257/698 |
| 5,019,943 | 5/1991 | Fassbender et al. .......... | 361/396 |
| 5,212,406 | 5/1993 | Reele et al. .............. | 257/723 |
| 5,373,189 | 12/1994 | Massit et al. ............. | 257/723 |
| 5,473,196 | 12/1995 | De Givry ................. | 257/786 |
| 5,600,183 | 2/1997 | Gates, Jr. ................ | 257/777 |
| 5,614,766 | 3/1997 | Takasu et al. ............ | 257/723 |
| 5,656,856 | 8/1997 | Kweon ................... | 257/685 |

FOREIGN PATENT DOCUMENTS

| | | |
|---|---|---|
| 0 531 724 A1 | 3/1993 | European Pat. Off. . |
| WO 95/14314 | 5/1995 | WIPO . |

*Primary Examiner*—Deborah Jones
*Assistant Examiner*—Cathy F. Lam
*Attorney, Agent, or Firm*—Gerald E. Linden; David Larwood

[57] ABSTRACT

High density packaging of semiconductor devices on an interconnection substrate is achieved by stacking bare semiconductor devices atop one another so that an edge portion of a semiconductor device extends beyond the semiconductor device that it is stacked atop. Elongate interconnection elements extend from the bottommost one of the semiconductor devices, and from the exposed edge portions of the semiconductor devices stacked atop the bottommost semiconductor device. Free-ends of the elongate interconnection elements make electrical contact with terminals of an interconnection substrate, such as a PCB. The elongate interconnection elements extending from each of the semiconductor devices are sized so as to reach the terminals of the PCB, which may be plated through holes. The elongate interconnection elements are suitably resilient contact structures, and may be composite interconnection elements comprising a relatively soft core (e.g., a gold wire) and a relatively hard overcoat (e.g., a nickel plating).

30 Claims, 6 Drawing Sheets

STACKING SEMICONDUCTOR DEVICES, PARTICULARLY MEMORY CHIPS

CROSS-REFERENCE TO RELATED APPLICATIONS

This patent application is a continuation-in-part of commonly-owned, copending U.S. Provisional Patent Application Ser. No. 60/046,028 filed May 9, 1997 by Khandros and Pedersen.

This patent application is also a continuation-in-part of commonly-owned, U.S. patent application Ser. No. 08/452,255 (hereinafter "PARENT CASE") filed May 26, 1995 and its counterpart/PCT patent application number PCT/US95/14909 filed Nov. 13, 1995, both of which are continuations-in-part of commonly-owned, U.S. patent application Ser. No. 08/340,144 filed Nov. 15, 1994 now U.S. Pat. No. 5,917,707 and its counterpart PCT patent application number PCT/US94/13373 filed Nov. 16, 1994, both of which are continuations-in-part of commonly-owned, U.S. patent application Ser. No. 08/152,812 filed Nov. 16, 1993 (now U.S. Pat. No. 5,476,211, Dec. 19, 1995), all of which are incorporated by reference herein.

TECHNICAL FIELD OF THE INVENTION

The present invention relates to resilient electrical contact (interconnection) elements (structures), also referred to as spring contacts, suitable for effecting pressure connections between electronic components and, more particularly, to microminiature spring contacts such as may be used in probing (resiliently and temporarily contacting) microelectronic components such as active semiconductor devices.

BACKGROUND OF THE INVENTION

Commonly-owned U.S. patent application Ser. No. 08/152,812 filed Nov. 16, 1993 (now U.S. Pat. No. 4,576,211, issued Dec. 19, 1995), and its counterpart commonly-owned copending "divisional" U.S. patent applications Ser. Nos. 08/457,479 filed Jun. 1, 1995 (status: pending) and Ser. No. 08/570,230 filed Dec. 11, 1995 (status: pending), all by KHANDROS, disclose methods for making resilient interconnection elements for microelectronics applications involving mounting an end of a flexible elongate core element (e.g., wire "stem" or "skeleton") to a terminal on an electronic component coating the flexible core element and adjacent surface of the terminal with a "shell" of one or more materials having a predetermined combination of thickness, yield strength and elastic modulus to ensure predetermined force-to-deflection characteristics of the resulting spring contacts. Exemplary materials for the core element include gold. Exemplary materials for the coating include nickel and its alloys. The resulting spring contact element is suitably used to effect pressure, or demountable, connections between two or more electronic components, including semiconductor devices.

Commonly-owned, copending U.S. patent application Ser. No. 08/340,144 filed Nov. 15, 1994 and its corresponding PCT Patent Application No. PCT/US94/13373 filed Nov. 16, 1994 (WO95/14314, Published May 26, 1995), both by KHANDROS and MATHIEU, disclose a number of applications for the aforementioned spring contact element, and also disclosed techniques for fabricating contact pads at the ends of the spring contact elements. For example, in FIG. 14 thereof, a plurality of negative projections or holes, which may be in the form of inverted pyramids ending in apexes, are formed in the surface of a sacrificial layer (substrate). These holes are then filled with a contact structure comprising layers of material such as gold or rhodium and nickel. A flexible elongate element is mounted to the resulting contact structure and can be overcoated in the manner described hereinabove. In a final step, the sacrificial substrate is removed. The resulting spring contact has a contact pad having controlled geometry (e.g., sharp points) at its free end.

The present invention addresses and is particularly well-suited to making interconnections to modern microelectronic devices having their terminals (bond pads) disposed at a finepitch. As used herein, the term "fine-pitch" refers to microelectronic devices that have their terminals disposed at a spacing of less than 5 mils, such as 2.5 mils or 65 $\mu$m. As will be evident from the description that follows, this is preferably achieved by taking advantage of the close tolerances that readily can be realized by using lithographic rather than mechanical techniques to fabricate the contact elements.

SUMMARY OF THE INVENTION

A general object of the invention is to provide an improved technique for packaging semiconductor devices.

Another object of the invention is to provide a technique for stacking semiconductor devices in close proximity with one another.

Another object of the invention is to provide an improved semiconductor package assembly.

According to the invention, bare semiconductor devices are stacked atop one another and are offset in at least one direction so that an edge portion of a semiconductor device stacked atop another semiconductor device is exposed (extends beyond the semiconductor device that it is stacked atop). Elongate interconnection elements extend from the bottommost one of the semiconductor devices, and from the exposed edge portions of the semiconductor devices stacked atop the bottommost semiconductor device. Free-ends of the elongate interconnection elements make electrical contact with terminals of an interconnection substrate, such as a PCB. The elongate interconnection elements extending from each of the semiconductor devices are sized so as to reach the terminals of the PCB, which may be plated through holes.

The elongate interconnection elements suitably are resilient contact structures, and may be the composite interconnection elements discussed in the aforementioned commonly-owned, copending PCT/US95/14909. These composite interconnection elements have a relatively soft core element, such as a gold wire, which is bonded at one end to a terminal (bond pad) of an electronic component (semiconductor device), shaped to have a springable shape, an opposite end being a "free end", and overcoated such as by plating with at least one layer of a relatively hard material such as nickel and its alloys.

Suitable materials for the core element of the composite interconnection element include, but are not limited to: gold, aluminum, copper, and their alloys. These materials are typically alloyed with small amounts of other metals to obtain desired physical properties, such as with beryllium, cadmium, silicon, magnesium, and the like. It is also possible to use silver, palladium, platinum; metals or alloys such as metals of the platinum group of elements. Solder constituted from lead, tin, indium, bismuth, cadmium, antimony and their alloys can be used.

Suitable materials for overcoating the core element include, but are not limited to: nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the palladium group and their alloys; tungsten and molybdenum. In cases where a solder-like finish is desired, tin, lead, bismuth, indium and their alloys can also be used.

Suitable processes for applying the overcoat material include: various processes involving deposition of materials out of aqueous solutions; electrolytic plating; electroless plating; chemical vapor deposition (CVD); physical vapor deposition (PVD); processes causing the deposition of materials through induced disintegration of liquid or solid precursors; and the like, all of these techniques for depositing materials being generally well known.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments. Certain elements in selected ones of the drawings are illustrated not-to-scale, for illustrative clarity. Often, similar elements throughout the drawings are referred to by similar references numerals. For example, the element 199 may be similar in many respects to the element 299 in another figure. Also, often, similar elements are referred to with similar numbers in a single drawing. For example, a plurality of elements 199 may be referred to as 199a, 199b, 199c, etc.

DETAILED DESCRIPTION OF THE INVENTION

The aforementioned commonly-owned, copending PCT/US94/13373 discloses free-standing resilient contact structures formed by bonding a flexible elongate member to a terminal of an electronic component, shaping and severing the elongate member to have a spring shape and a free end, and overcoating the shaped elongate member with a conductive material. A plurality of such resilient contact structures may be mounted to an electronic component such as a semiconductor device (see, e.g., FIG. 24 therein), and individually sized and shaped so that their tips (free ends) are at a different pitch (spacing) than their bases. A number of semiconductor devices having resilient contact structures mounted thereto can be assembled to an interconnection substrate such as a printed circuit board to form a semiconductor package assembly. For example, FIG. 36 therein shows semiconductor devices in the form of face-down mounted chips (621) disposed on opposite sides of the interconnection substrate (612). The semiconductor devices (621) are each provided with a plurality of resilient contact structures (626) mounted thereon.

Figure 1:
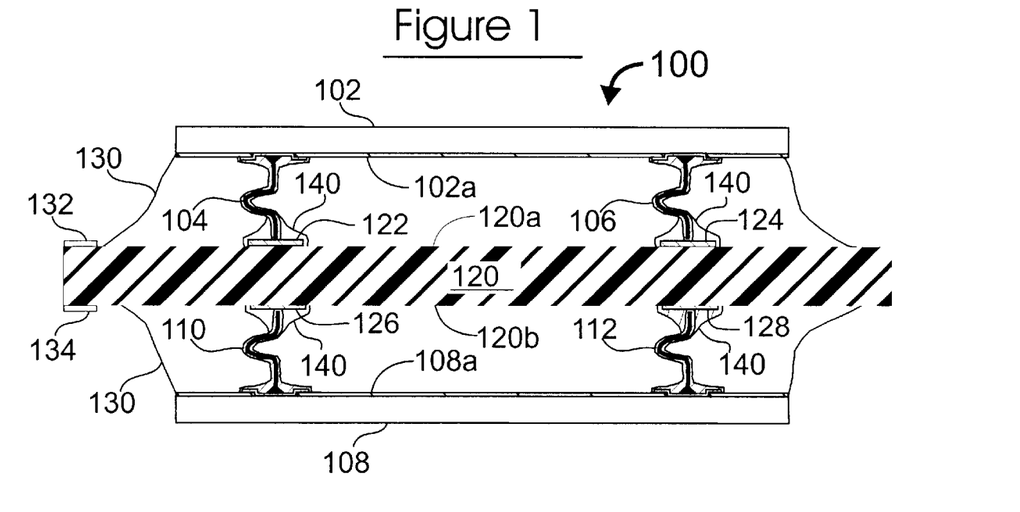
FIG. 1 is a cross-sectional view of a semiconductor package assembly of one of the parent cases.

Such a construction of a semiconductor package assembly is illustrated in FIG. 1, which corresponds to FIG. 25 of the aforementioned commonly-owned, copending PCT/US95/14909.

FIG. 1 shows a semiconductor package assembly 100. One semiconductor die 102 is disposed on a one side 120a of an interconnection substrate 120. Another semiconductor die 108 is disposed on an opposite side of the interconnection substrate 120. The one side 120a of the interconnection substrate 120 is provided with a plurality (two of many shown) of terminals 122 and 124. The opposite side 120b of the interconnection substrate 120 is provided with a plurality (two of many shown) of terminals 126 and 128. The one semiconductor device 102 is provided with a plurality (two of many shown) of free-standing elongate resilient contact structures 104 and 106 extending from a surface 102a thereof. The other semiconductor device 108 is provided with a plurality (two of many shown) of free-standing elongate resilient contact structures 110 and 112 extending from a surface 108a thereof. The semiconductor devices 102 and 108 are positioned against the interconnection substrate so that the contact structures 104 and 106 contact the terminals 122 and 124, respectively, and so that the contact structures 110 and 112 contact the terminals 126 and 128, respectively. The tips (ends) of the contact structures 104, 106, 110, 112 may be soldered or brazed, as indicated by the fillets 140, to the respective terminals 122, 124, 126, 128. The semiconductor devices may be encapsulate with an encapsulant 130. The interconnection substrate 120 is provided with additional terminals 132 and 134, such as in the form of edge connectors.

Figure 2:
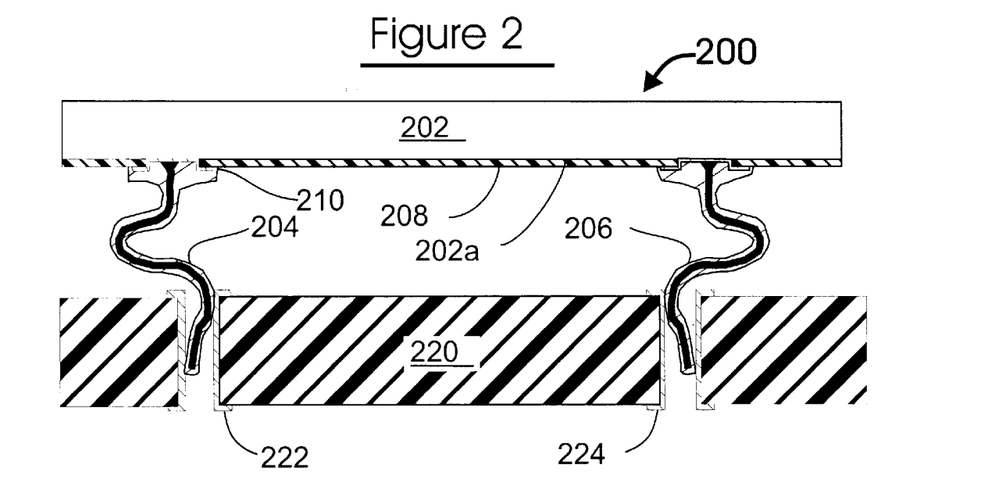
FIG. 2 is a cross-sectional view of a semiconductor package assembly of one of the parent cases.

Alternatively, in this embodiment and in the embodiments that follow of mounting semiconductor devices (or, as will be discussed, "stacks" of semiconductor devices) to an interconnection substrate (e.g., printed circuit board), it is within the scope of this invention that the tips (ends) of the contact structures are secured and electrically-connected to the terminals of the interconnection substrate using a suitable conductive adhesive, such as silver-filled epoxy, rather than by soldering or brazing. Yet another alternate technique for securing and electrically-connecting which is applicable to the various embodiments disclosed herein is shown in FIG. 2, wherein the tips or end portions of the contact structures fit snugly within conductive holes (e.g., plated through holes) in the interconnection substrate. Also, a conductive adhesive (e.g., silver-filled epoxy) can be used to connect the end portions of the contact structures into conductive holes in the interconnection substrate, without requiring a snug fit (and preferably with a loose fit) between the contact structures and the sidewalls of the holes.

Figure 1A:
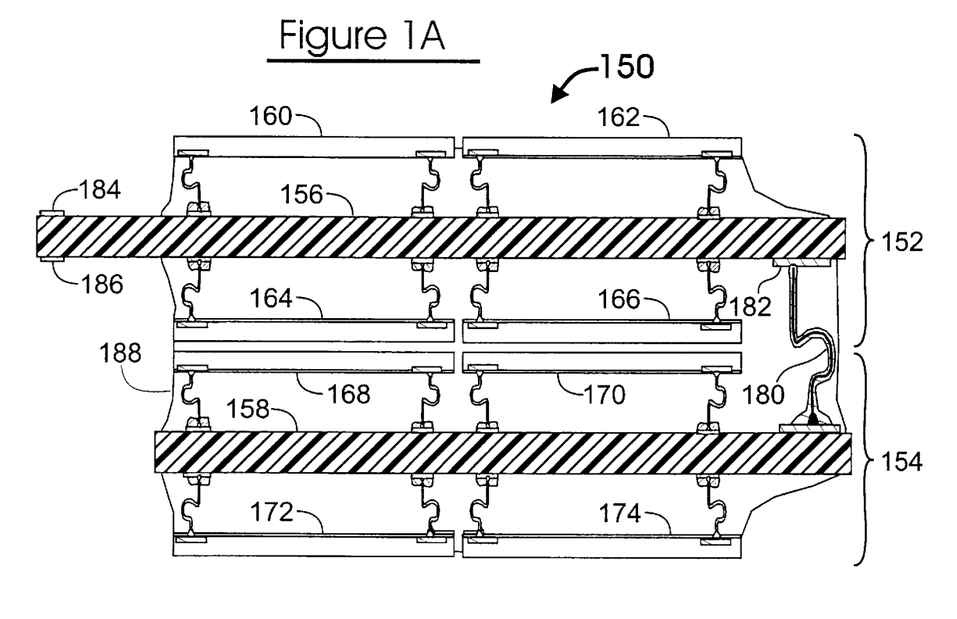
FIG. 1A is a cross-sectional view of a semiconductor package assembly of one of the parent cases.

FIG. 1A corresponds to FIG. 37 of the aforementioned commonly-owned, copending PCT/US94/13373 and PCT/US95/14909 and illustrates board-to-board stacking.

FIG. 1A shows two individual semiconductor package assemblies 152 and 154, each of which is generally of the type shown in FIG. 1. Each individual semiconductor package assembly is shown as having two semiconductor devices disposed on each of two opposite surfaces of a respective interconnection substrate 156 and 158. Two semiconductor devices 160 and 162 are disposed on a one side of a one interconnection substrate 156, two semiconductor devices 164 and 166 are disposed on an opposite side of the one interconnection substrate 156, two semiconductor devices 168 and 170 are disposed on a one side of an other interconnection substrate 158, and two semiconductor devices 172 and 174 are disposed on an opposite side of the other interconnection substrate 158. The two interconnection substrates 156 and 158 may be printed circuit boards (PCBs), and are substantially similar to one another, with the following difference(s). A one of the two interconnection substrates, for example the substrate 158, is provided with a plurality (one of many shown) of free-standing elongate interconnection elements 180, and the other of the two interconnection substrates, for example the substrate 156 is provided with a corresponding plurality (one of many shown) of terminals 182. When the two substrates 156 and 158 are brought together, the ends (tips) of the interconnection elements 180 make contact with the corresponding terminals 182. A one of the two interconnection substrates, for example the substrate 156, is provided with additional terminals 184 and 186 (compare 132 and 134) for making connections to external systems. The assembly of the two interconnection substrates 156 and 158 is suitably encapsulated with a potting compound 188 (compare 130).

Another method of interconnecting semiconductor devices to interconnection substrates is illustrated in FIG. 2, which corresponds to FIG. 28 of the aforementioned commonly-owned, copending PCT/US95/14909.

FIG. 2 shows another semiconductor package assembly 200. A semiconductor device 202 is disposed on a one side 120a of an interconnection substrate 220. The interconnection substrate has a plurality (two of many shown) of plated through holes 222 and 224. The semiconductor device 202 is provided with a plurality (two of many shown) of free-standing elongate resilient contact structures 204 and 206) extending from a surface thereof.

The semiconductor device 202 is positioned against the interconnection substrate so that tips (ends) of the contact structures 204 and 206 insert into the through holes 222 and 224, respectively. The tips (ends) of the contact structures 204 and 206 may be soldered or brazed (not shown) into the respective through holes 222 and 224.

In the semiconductor package assemblies (100, 200) described hereinabove, there has been illustrated one "layer" of semiconductor devices per side (surface) of the interconnection substrate (102, 202).

Given limited "real estate" to work with on the interconnection substrate, certain advantages will accrue to stacking semiconductor devices, one atop another, on an interconnection substrate. In other words, more silicon (e.g., signal processing, power, or memory) per square inch (of interconnection substrate).

Figure 3:
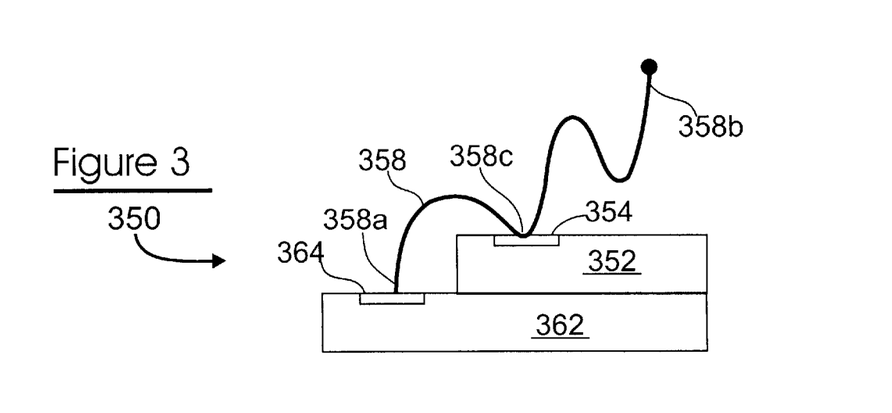
FIG. 3 is a cross-sectional view of a technique for stacking semiconductor devices, according to one of the parent cases.

A method of stacking and interconnecting semiconductor devices is illustrated in FIG. 3, which corresponds to FIG. 16E of the aforementioned commonly-owned, copending PCT/US95/14909.

FIG. 3 shows a technique 350 for stacking semiconductor devices, one atop another. A first semiconductor device 352 is disposed atop a second semiconductor device 362. A wire 358 is bonded at one end 358a to a terminal (pad) 364 on the second electronic component 362, is payed out to have some slack, is bonded at a midportion thereof 358c to a terminal (pad) 354 of the first semiconductor device 352, is payed out and configured to have a springable shape, and is severed to have a free end 358b. The shaped wire stem (portion of the wire between the free end 358b and the midportion 358c) is then suitably plated (not shown) to become a resilient contact structure. In this technique, it is evident that the stacked semiconductor devices are connected to one another, rather than individually connected to an interconnection substrate (not shown).

According to the invention, a technique is provided for stacking semiconductor devices such as memory chips atop one another so that an edge of each semiconductor device is exposed. Free-standing elongate interconnection elements, which may be the resilient contact structures of the aforementioned commonly-owned, copending PCT/US94/13373 are mounted along the exposed edges of the stacked semiconductor devices. For each semiconductor device, free-standing elongate interconnection elements are of sufficient length so that their tips (free ends) make contact with terminals on an interconnection substrate upon which the stacked semiconductor devices are mounted. In this manner, many semiconductor devices can individually (independently) be connected to an interconnection substrate in a space (area of the interconnection substrate) that is only slightly larger than a given one of the semiconductor dies.

Figure 4A:
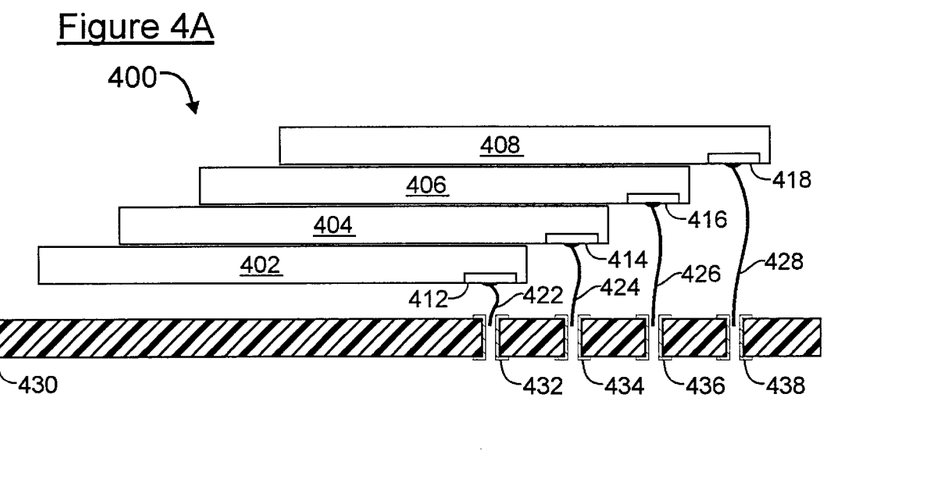
FIG. 4A is a cross-sectional view of a technique for stacking semiconductor devices, according to the invention.
Figure 4B:
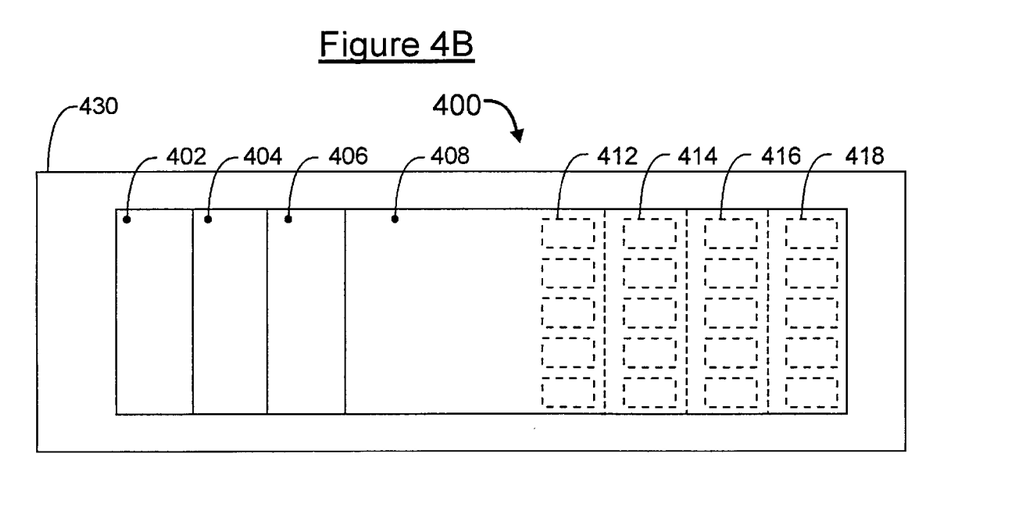
FIG. 4B is a top plan view of the technique illustrated in FIG. 4A, according to the invention.

FIGS. 4A and 4B illustrate a technique for stacking semiconductor devices, such as memory chips, according to the invention. A plurality (four of many shown) of "bare" (not packaged) semiconductor devices 402, 404, 406, 408, suitably (but not necessarily) all of the same size as one another, are stacked in face-to-face relationship. In other words, each semiconductor device has a front surface and a back surface and, for example, the front surface of the semiconductor devices 408, 406 and 404 are adjacent the back surfaces of the semiconductor devices 406, 404 and 402, respectively.

A plurality (five of many shown) of terminals (bond pads) 412, 414, 416, 418 are disposed along a one common edge of the four semiconductor devices 402, 404, 406, 408, respectively.

Elongate, preferably resilient contact structures 422, 424, 426, 428 extend from respective terminals 412, 414, 416, 418 of the respective semiconductor devices 402, 404, 406, 408. These may be the composite interconnection elements of the aforementioned commonly-owned, copending PCT/US95/14909.

The tips (ends) of the elongate interconnection elements 422, 424, 426, 428 are connected in any suitable manner to a plurality of terminals on an interconnection substrate 430, such as by inserting (and soldering or brazing, not shown) into corresponding plated through holes 432, 434, 436, 438, respectively, in the interconnection substrate 430. It is within the scope of this invention that the end portions of the interconnection elements are sized and shaped to make a good interference (pressure) fit within the through hole terminals without requiring soldering or brazing.

As illustrated in FIG. 4A, the elongate interconnection elements (e.g., 428) of a one semiconductor device (e.g., 408) are suitably longer (extend further from the surface of the semiconductor device to which they are mounted) than the elongate interconnection elements (e.g., 422) of another semiconductor device (e.g., 402) in the stack up so that their free ends (tips, bottom ends, as viewed) are all coplanar, which is suitable for making connections to a plurality of terminals (e.g., 432, 438) of an interconnection substrate (430) which are coplanar. This is one of the advantages of using the resilient contact structures (composite interconnection elements) of the aforementioned parent case(s). It is within the scope of this invention that, if necessary, individual ones or sets of elongate interconnection elements can be of different lengths to make contact with terminals of interconnection substrates which are not coplanar, or with terminals of other electronic components (not shown) which may be disposed on the surface of the interconnection substrate.

It is, however, within the scope of this invention that the various "sets" of elongate interconnection elements all have the same length, particularly in the case of the plated through holes being sufficiently "deep" so that, for example, the ends of the interconnection elements 422 penetrate substantially all the way into the through holes 432, the interconnection elements 424 penetrate somewhat less into the through holes 434, the interconnection elements 426 insert somewhat less into the through holes 436, and the interconnection elements 428 insert even less (but sufficiently) into the through holes 438, the interconnection elements of each semiconductor device penetrating the interconnection substrate by different amounts depending on what level of the stackup the originate from. This would facilitate inventorying semiconductor devices, all having the same length interconnection elements mounted thereto, for later stacking and assembly to an interconnection substrate.

The assembly of stacked semiconductor devices (402, 404, 406, 408 on an interconnection substrate 430 is termed a "semiconductor package assembly" 400. This assembly of stacked semiconductor devices is mounted to the surface of the interconnection substrate in any suitable manner. For example, the bottommost semiconductor device 402 in the stack may be spaced from the surface of the interconnection substrate 430 using a spacer such as a 2 mil thick insulating film such as teflon (tm). In a similar manner, the semiconductor devices in the stack (assembly) can be spaced apart from one another using a thin insulating film (e.g., 610) between the front of a one semiconductor device (e.g., 404) and a back of a lower in the stack semiconductor device (e.g., 402). Such insulating films are known, and are omitted from the drawings. For inventorying pre-fabricated stacks (subassemblies) of semiconductor devices for later mounting to an interconnection substrate, the semiconductor devices should be adhered to one another with a suitable adhesive.

The technique of forming a semiconductor package assembly with stacked, offset (so that at least one edge portion of each semiconductor device stacked atop another semiconductor device is exposed) semiconductor devices and elongate interconnection elements making connections between the stacked semiconductor devices and an interconnection substrate can be extended, as follows.

Figure 5:
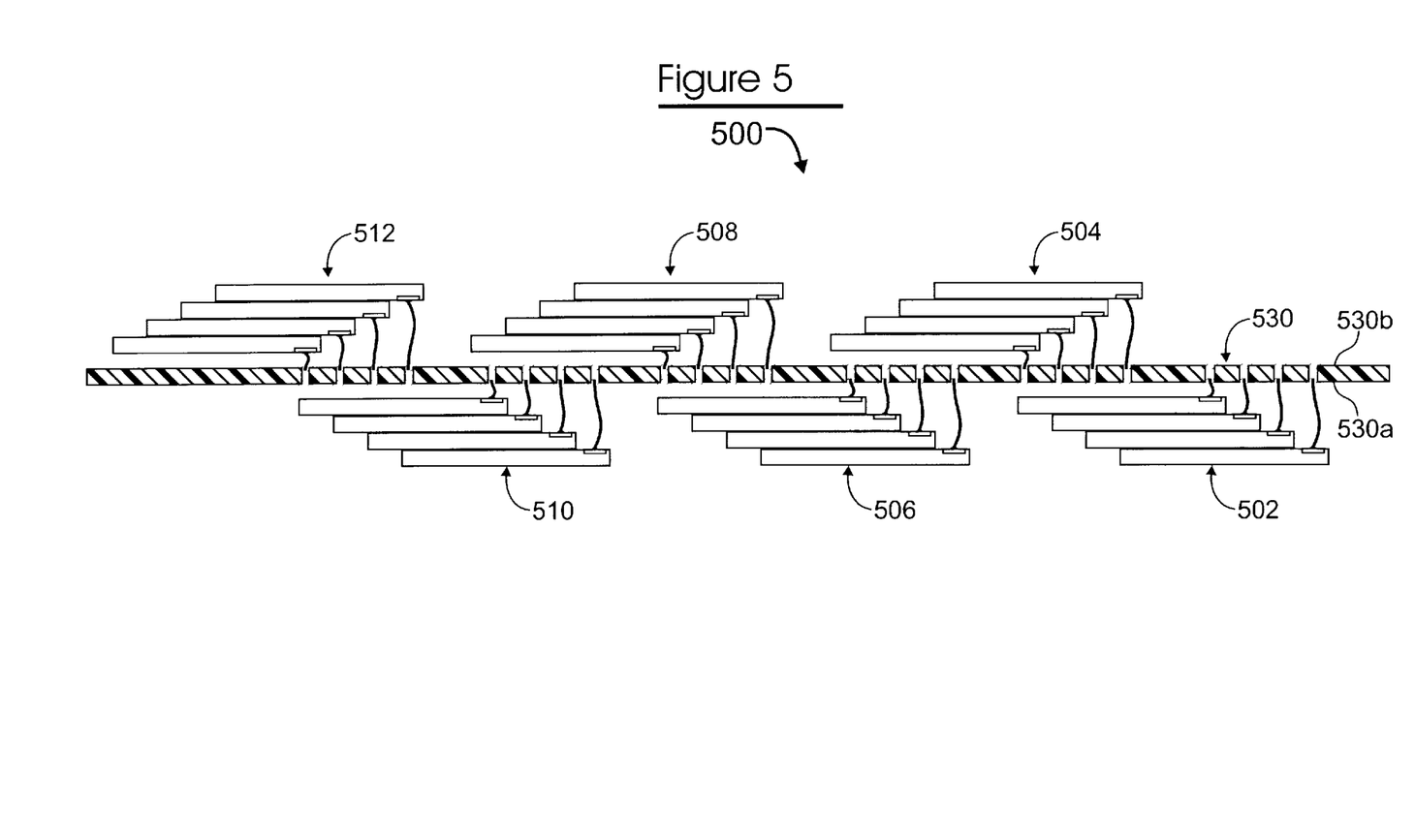
FIG. 5 is a side cross-sectional view of a semiconductor package assembly having several sets of stacked semiconductor devices, according to the invention.

FIG. 5 illustrates a plurality of sets of stacked semiconductor devices connected to (sharing) a common (single) interconnection substrate 530 (compare 430). As illustrated, a first set (subassembly) of offset-stacked semiconductor devices 502 (compare 402, 404, 406, 408), each device having elongate interconnection elements (compare 422, 424, 426, 428) mounted to and extending from an exposed edge thereof, is connected to a first side 530a of the interconnection substrate 530. In a similar manner, a second set (subassembly) of offset-stacked semiconductor devices 504 (compare 402, 404, 406, 408), each device having elongate interconnection elements (compare 422, 424, 426, 428) mounted to and extending from an exposed edge thereof, is connected to a second (opposite) side 530b of the interconnection substrate 530 at a position which is offset in a first direction from being directly opposite the first set of offset-stacked semiconductor devices 502. In a similar manner, a third set of offset-stacked semiconductor devices 506 is connected to the first side 530a of the interconnection substrate 530 at a position which is offset in the first direction from being directly opposite the second set of offset-stacked semiconductor devices 504. In a similar manner, a fourth set of offset-stacked semiconductor devices 508 is connected to the second side 530b of the interconnection substrate 530 at a position which is offset in the first direction from being directly opposite the third set of offset-stacked semiconductor devices 506. In a similar manner, a fifth set of offset-stacked semiconductor devices 510 is connected to the first side 530a of the interconnection substrate 530 at a position which is offset in the first direction from being directly opposite the fourth set of offset-stacked semiconductor devices 508. In a similar manner, a sixth set of offset-stacked semiconductor devices 512 is connected to the second side 530b of the interconnection substrate 530 at a position which is offset in the first direction from being directly opposite the fifth set of offset-stacked semiconductor devices 510.

It is within the scope of this invention that the elongate interconnection elements of two semiconductor devices or, more particularly, two stacks of semiconductor devices (e.g., 502 and 504) can be inserted into the same through hole terminals of an interconnection substrate rather than different offset sets of through hole terminals (as is illustrated in FIG. 5), from opposite sides of the interconnection substrate, in which case the two stacks of semiconductor devices would be directly opposite one another rather than offset from one another (as is illustrated in FIG. 5).

Figure 6:
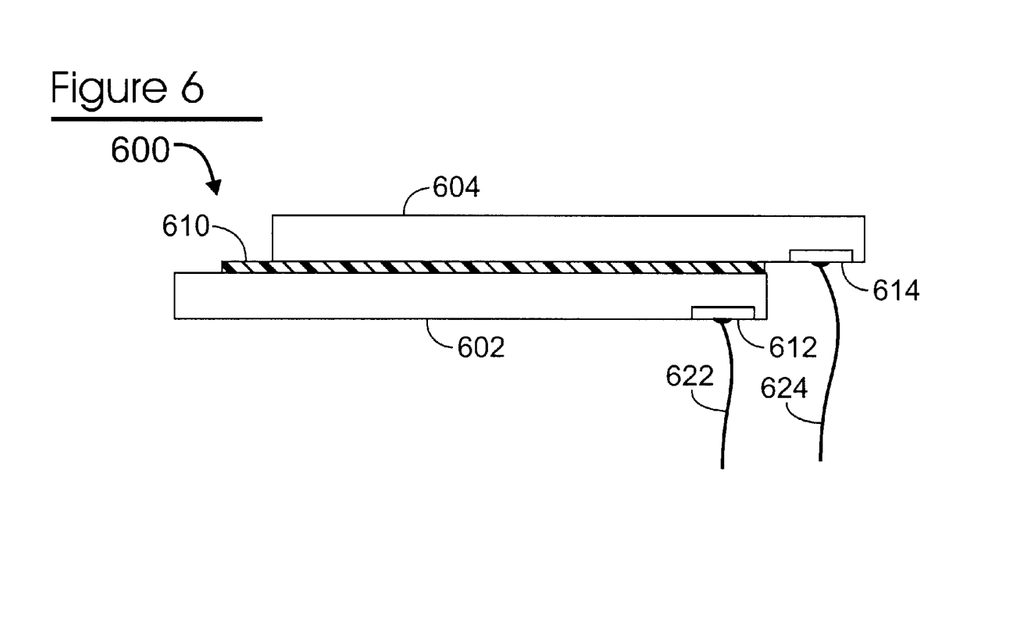
FIG. 6 is a side cross-sectional view of a detail of stacked semiconductor devices, according to the invention.

Generally, the stacked semiconductor devices (e.g., 402, 404, 406, 408) may simply be glued to one another, front-to-back. FIG. 6 illustrates a preferred method of stacking a plurality (two of many shown) of semiconductor devices 602 (compare 402) and 604 (compare 404) wherein a thin (e.g., 2 mils thick) sheet 610 of an insulating material is inserted between the front of the one semiconductor device 604 and the back of the other semiconductor device 602. These semiconductor devices have terminals 612 (compare 412) and 614 (compare 414) on the exposed edge portions of their front surfaces, to which elongate interconnection elements 622 (compare 422) and 624 (compare 424) are mounted, in the manner described hereinabove.

Figure 7:
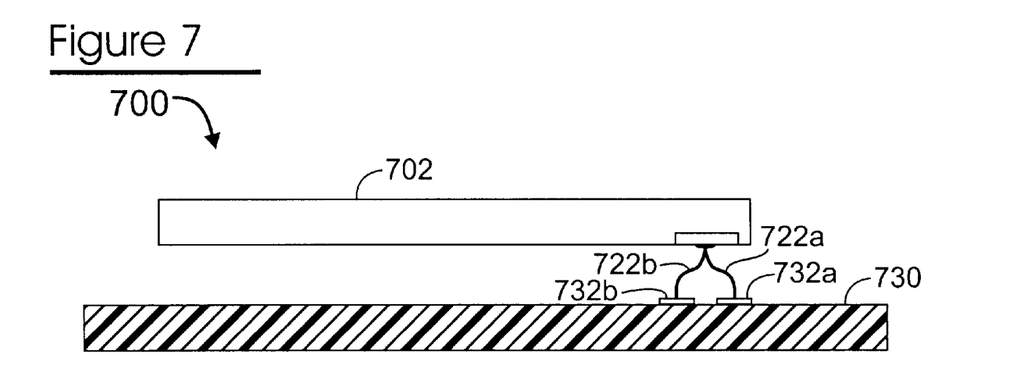
FIG. 7 is a side cross-sectional view of a detail of an alternate technique for mounting semiconductor devices to an interconnection substrate, according to the invention.

As is known, semiconductor devices are suitably provided with terminals in the form of bond pads which are at a relatively fine pitch (spacing between adjacent bond pads). It is also known that interconnection substrates such as printed circuit boards (PCBS) require a relatively coarser pitch between adjacent terminals. It is within the scope of this invention that the elongate interconnection elements (e.g., 422, 622) are shaped and oriented so that their tips (ends) are at a coarser pitch than their bases (i.e., the terminals to which they are mounted). This is illustrated in FIG. 7, comparable to FIG. 15A of the aforementioned commonly-owned, copending PCT/US95/14909, which shows two elongate interconnection elements 722a and 722b extending from corresponding two (only one visible in this side cross-sectional view) adjacent terminals of a semiconductor device 702 (compare 402, 602). As illustrated, the two interconnection elements 722a and 722b are oriented in opposite directions from one another so that their free ends (tips) are at a greater pitch than their base ends. Consequently, the terminals 732a and 732b (compare 122, 124) on the interconnection substrate 730 (compare 120, 220, 430, 530) may be spaced farther apart than the terminals on the semiconductor device 702. The terminals 732a and 732b may be of the plated through-hole type.

Figure 8A:
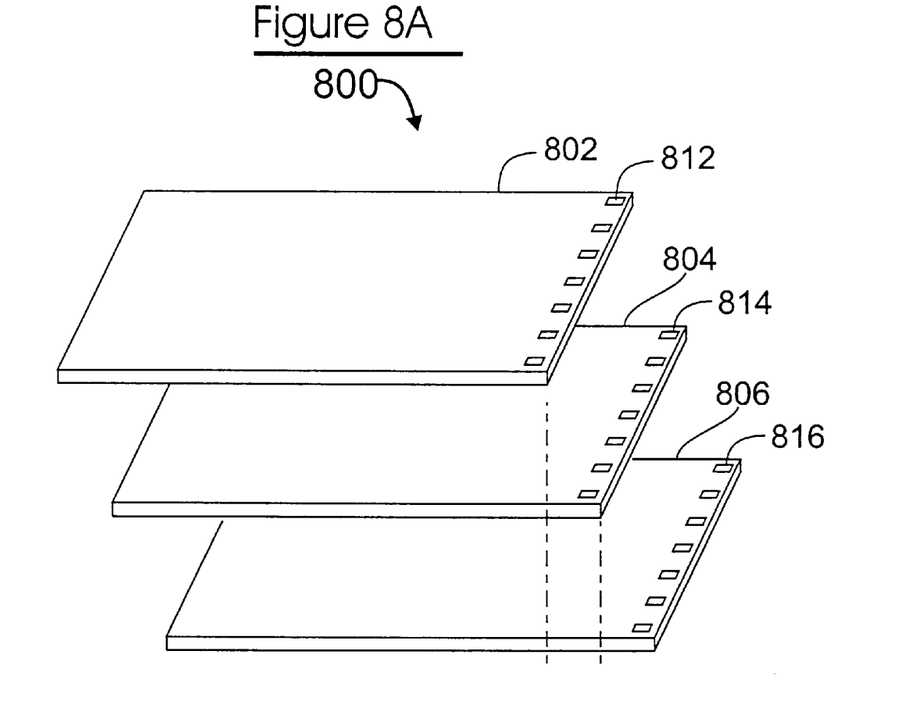
FIG. 8A is a perspective exploded view of three semiconductor devices being stacked up, according to the invention.

FIG. 8A is an exploded view of three rectangular semiconductor devices 802 (compare 402), 804 (compare 404) and 806 (compare 406), such as memory chips, being stacked up and offset in one direction (e.g., lengthwise) so that their side edges (towards and away from the viewer) are aligned with one another, and offset (staggered) progressively from a one side (right, as viewed) to another side (left, as viewed) so that each semiconductor device has a edge portion (right, as viewed) that is exposed. The exposed edge portions are rectangular. The terminals 812 (compare 412), 814 (compare 414) and 816 (compare 416) are thus exposed, and carry elongate interconnection elements (not shown, compare 422, 424, 426) which would extend in an upwards (as viewed) direction to engage and make contact with corresponding terminals of an interconnection substrate (not shown, compare FIG. 4). In this arrangement, the semiconductor devices have a single "common" edge portion that is exposed.

Figure 8B:
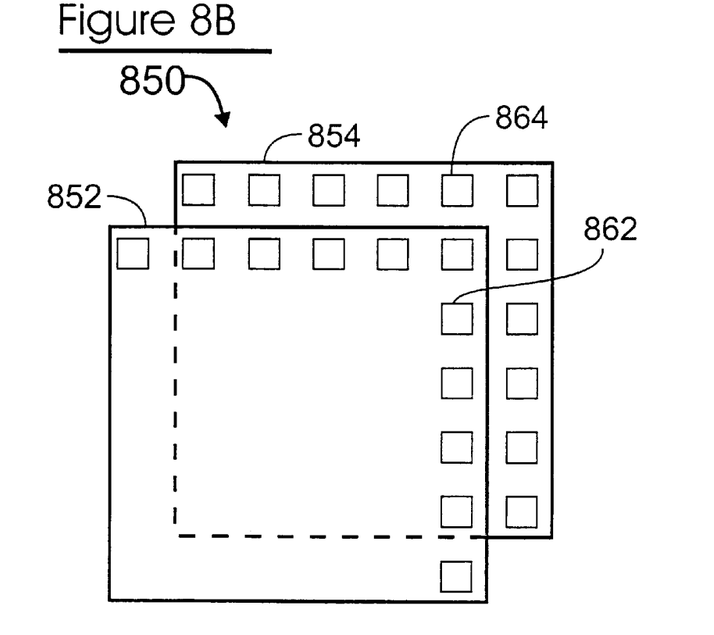
FIG. 8B is a top plan view of two semiconductor devices being stacked up, according to the invention.

FIG. 8B is a plan view of a plurality (two of many shown) of square semiconductor devices 852 (compare 802) and 854 (compare 804), such as memory chips, being stacked up in a diagonal offset manner 850 (i.e., offset in two directions) so that none of their side edges are aligned with one another. In this diagonal offset configuration, two adjacent side edge portions (top and right, as viewed) of each semiconductor device are exposed, and the exposed edge portion is L-shaped. The terminals 862 (compare 812) and 864 (compare 814) are disposed along one or both (as shown) legs of the L-shaped exposed edge portion, and carry elongate interconnection elements (not shown, compare 422, 424, 426) which would extend from the terminal surface of the semiconductor die (towards the viewer) to engage and make contact with corresponding terminals of an interconnection substrate (not shown, compare FIG. 4).

The offset stacked configurations described hereinabove imply that the terminals of the semiconductor devices being stacked up are along one or more edge portions of the semiconductor devices at locations whereat they may be exposed for carrying elongate interconnection elements making contact with terminals of an interconnection substrate.

Figure 9:
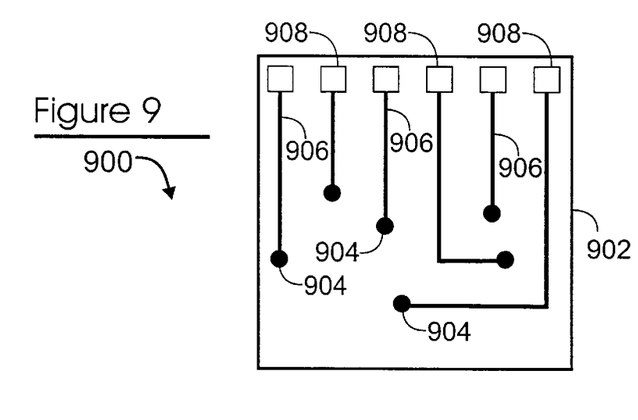
FIG. 9 is a schematic representation of how connections on a semiconductor device can be re-routed, incident to stacking the semiconductor devices, according to the invention.

FIG. 9 illustrates schematically a situation where the bond pads (terminals) 904 of a given semiconductor device 902 (compare 102, 202, 402, 603, 702, 802, etc.) are not disposed at the desired location (e.g., along one or two edges of the semiconductor device). In this situation, a plurality (six of many shown) of conductive lines 906 can be applied to the semiconductor device 902, using conventional semiconductor processing techniques (e.g., applying, masking and etching metal) to connect between the plurality (six of many shown) of bond pads 904 and terminals 908 which are formed at the desired locations along the one or two edges of the semiconductor device. In this manner, the terminals of the semiconductor devices described herein can be re-routed from an initial location 904 to a desired (e.g., edge) location 908 on the semiconductor device.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

What is claimed is:

1. A semiconductor package assembly, comprising:
   an interconnection substrate having a plurality of terminals;
   a first bare semiconductor device having a front surface and a back surface, and also comprising a plurality of terminals on the front surface;
   a second bare semiconductor device stacked atop the first semiconductor device having a front surface and a back surface, and also comprising a plurality of terminals on the front surface,
   each of the first and second bare semiconductor devices having a front surface and a back surface;
   the second bare semiconductor device disposed in an offset stacked manner so that the front surface of the second bare semiconductor device is adjacent the back surface of the first bare semiconductor device, and an edge portion of the second bare semiconductor device is exposed beyond an edge of the first bare semiconductor device;
   a first set of elongate interconnection elements extending from the terminals on the front surface of the first bare semiconductor device, said first set of elongate interconnection elements having free ends contacting a first portion of the plurality of terminals on the interconnection substrate; and
   a second set of elongate interconnection elements extending from the terminals on the front surface of the second bare semiconductor device, said terminals disposed in the edge portion of the second bare semiconductor device, said second set of elongate interconnection elements having free ends contacting a second portion of the plurality of terminals on the interconnection substrate
   wherein the terminals on the interconnection substrate are plated through holes.

2. The semiconductor package assembly, according to claim 1, wherein:
   the second bare semiconductor device is offset in one direction from the first bare semiconductor device so that the edge portion is rectangular.

3. The semiconductor package assembly, according to claim 1, wherein:
   the second bare semiconductor device is offset in two directions from the first bare semiconductor device so that the edge portion is L-shaped.

4. The semiconductor package assembly, according to claim 1, further comprising:
   a third additional bare semiconductor device having a front surface and a back surface; and also comprising a plurality of terminals on the front surface, the third bare semiconductor device disposed atop the second bare semiconductor device in an offset stacked manner so that the front surface of the third bare semiconductor device is adjacent the back surface of the second bare semiconductor device, and an edge portion of the third bare semiconductor device is exposed beyond an edge of the second bare semiconductor device;

a third set of elongate interconnection elements extending from the terminals on the front surface of the third bare semiconductor device, said terminals disposed in the edge portion of the third bare semiconductor device, said third set of elongate interconnection elements having free ends contacting a third portion of the plurality of terminals on the interconnection substrate.

5. The semiconductor package assembly, according to claim 1, wherein the first and second bare semiconductor devices comprise a first stacked subassembly, and further comprising:

a second stacked subassembly formed in the manner of the first stacked subassembly;

the elongate interconnection elements of the second stacked subassembly having free ends contacting a third portion of the plurality of terminals on the interconnection substrate and a fourth portion of the plurality of terminals on the interconnection substrate.

6. The semiconductor package assembly, according to claim 5, wherein the interconnection substrate has a front surface and a back surface; and wherein:

the first and second plurality of terminals on the interconnection substrate are disposed on the front surface of the interconnection substrate; and the third plurality of terminals on the interconnection substrate are disposed on the front surface of the interconnection substrate.

7. The semiconductor package assembly, according to claim 5, wherein the interconnection substrate has a front surface and a back surface; and wherein:

the first and second plurality of terminals on the interconnection substrate are disposed on the front surface of the interconnection substrate; and the third plurality of terminals on the interconnection substrate are disposed on the back surface of the interconnection substrate.

8. The semiconductor package assembly, according to claim 1, wherein:

the interconnection substrate is a printed circuit board.

9. The semiconductor package assembly, according to claim 1, wherein:

the semiconductor devices are memory chips.

10. The semiconductor package assembly, according to claim 1, wherein:

the elongate interconnection elements are resilient contact structures.

11. The semiconductor package assembly, according to claim 1, wherein:

selected ones of the terminals of at least one of the first and second bare semiconductor devices are re-routed from an initial location to a desired location on the semiconductor device.

12. The semiconductor package assembly, according to claim 1, further comprising:

a material selected from the group consisting of solder, braze and conductive epoxy securing the free ends of the interconnection elements to the terminals on the interconnection substrate.

13. A semiconductor package assembly, comprising:

an interconnection substrate having a plurality of terminals;

a first bare semiconductor die having a first surface facing the interconnection substrate and a second surface; and also comprising a plurality of terminals on the first surface;

a second bare semiconductor die having a first surface facing the interconnection substrate and a second surface, and stacked atop the first semiconductor die; and also comprising a plurality of terminals on the first surface;

the second bare semiconductor die disposed in an offset stacked manner so that the first surface of the second bare semiconductor die is adjacent the second surface of the first bare semiconductor die, and an edge portion of the second bare semiconductor die is exposed beyond an edge of the first bare semiconductor die;

a first set of elongate interconnection elements extending from the terminals on the first surface of the first bare semiconductor die, said first set of elongate interconnection elements having free ends contacting a first portion of the plurality of terminals on the interconnection substrate; and a second set of elongate interconnection elements extending from the terminals on the first surface of the second bare semiconductor die, said terminals disposed in the edge portion of the second bare semiconductor die, said second set of elongate interconnection elements having free ends contacting a second portion of the plurality of terminals on the interconnection substrate wherein the terminals on the interconnection substrate are plated through holes.

14. The semiconductor package assembly, according to claim 13, wherein:

the second bare semiconductor die is offset in at least one dimension so that the second bare semiconductor die extends beyond an edge of the first semiconductor die.

15. The semiconductor package assembly, according to claim 13, wherein the first and second bare semiconductor die comprise a first stacked subassembly, and further comprising:

a second stacked subassembly formed in the manner of the first stacked subassembly;

the elongate interconnection elements of the second stacked subassembly having free ends contacting a third portion of the plurality of terminals on the interconnection substrate and a fourth portion of the plurality of terminals on the interconnection substrate.

16. The semiconductor package assembly, according to claim 15, further comprising the interconnection substrate having a first surface and a second surface, and wherein:

the first stacked subassembly is disposed on the first surface of the substrate; and the second stacked subassembly is disposed on the second surface of the substrate.

17. The semiconductor package assembly, according to claim 13, wherein:

the interconnection substrate is a printed circuit board.

18. The semiconductor package assembly, according to claim 13, wherein:

the semiconductor die are memory chips.

19. The semiconductor package assembly, according to claim 13, wherein:

the elongate interconnection elements are resilient contact structures.

20. The semiconductor package assembly, according to claim 13, wherein:
   selected ones of the terminals of at least one of the first and second bare semiconductor devices are re-routed from an initial location to a desired location on the semiconductor device.

21. The semiconductor package assembly, according to claim 13, further comprising:
   a material selected from the group consisting of solder, braze and conductive epoxy securing the free ends of the interconnection elements to the terminals on the interconnection substrate.

22. The semiconductor package assembly, comprising:
   an interconnection substrate having a plurality of terminals;
   a first bare semiconductor die having a first surface facing the interconnection substrate and a second surface; and also comprising a plurality of terminals on the first surface;
   a second bare semiconductor die having a first surface facing the interconnection substrate and a second surface, and stacked atop the first semiconductor die; and also comprising a plurality of terminals on the first surface;
   the second bare semiconductor die disposed in an offset stacked manner so that the first surface of the second bare semiconductor die is adjacent the second surface of the first bare semiconductor die, and an edge portion of the second bare semiconductor die is exposed beyond an edge of the first bare semiconductor die;
   a first set of elongate interconnection elements extending from terminals on the first surface of the first bare semiconductor die, said first set of elongate interconnection elements having free ends directly in contact with a first portion of the plurality of terminals on the interconnection substrate; and
   a second set of elongate interconnection elements extending from terminals on the first surface of the second bare semiconductor die, said terminals disposed in the edge portion of the second bare semiconductor die, said second set of elongate interconnection elements having free ends directly in contact with a second portion of the plurality of terminals on the interconnection substrate
   wherein the terminals on the interconnection substrate are plated through holes.

23. The semiconductor package assembly, according to claim 22, wherein:
   the second bare semiconductor die is offset in at least one dimension so that the second bare semiconductor die extends beyond an edge of the first semiconductor die.

24. The semiconductor package assembly, according to claim 22, wherein the first and second bare semiconductor dice comprise a first stacked subassembly, and further comprising:
   a second stacked subassembly formed in the manner of the first stacked subassembly;
   the elongate interconnection elements of the second stacked subassembly having free ends directly in contact with a third portion of the plurality of terminals on the interconnection substrate and a fourth portion of the plurality of terminals on the interconnection substrate.

25. The semiconductor package assembly, according to claim 24, further comprising the interconnection substrate having a first surface and a second surface, and wherein:
   the first stacked subassembly is disposed on the first surface of the substrate; and
   the second stacked subassembly is disposed on the second surface of the substrate.

26. The semiconductor package assembly, according to claim 22, wherein:
   the interconnection substrate is a printed circuit board.

27. The semiconductor package assembly, according to claim 22, wherein:
   the semiconductor devices are memory chips.

28. The semiconductor package assembly, according to claim 22, wherein:
   the elongate interconnection elements are resilient contact structures.

29. The semiconductor package assembly, according to claim 22, wherein:
   selected ones of the terminals of at least one of the first and second bare semiconductor devices are re-routed from an initial location to a desired location on the semiconductor device.

30. The semiconductor package assembly, according to claim 22, further comprising:
   a material selected from the group consisting of solder, braze and conductive epoxy securing the free ends of the interconnection elements to the terminals on the interconnection substrate.

* * * * *